US009214435B2

(12) United States Patent
Farooq et al.

(10) Patent No.: US 9,214,435 B2
(45) Date of Patent: Dec. 15, 2015

(54) VIA STRUCTURE FOR THREE-DIMENSIONAL CIRCUIT INTEGRATION

(75) Inventors: Mukta G. Farooq, Hopewell Junction, NY (US); Troy L. Graves-Abe, Wappingers Falls, NY (US); Spyridon Skordas, Troy, NY (US); Kevin R. Winstel, East Greenbush, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 277 days.

(21) Appl. No.: 13/476,056

(22) Filed: May 21, 2012

(65) Prior Publication Data

US 2013/0307160 A1 Nov. 21, 2013

(51) Int. Cl.
| | |
|---|---|
| H01L 21/768 | (2006.01) |
| H01L 23/00 | (2006.01) |
| H01L 23/48 | (2006.01) |
| H01L 25/065 | (2006.01) |
| H01L 23/538 | (2006.01) |
| H01L 27/06 | (2006.01) |

(52) U.S. Cl.
CPC .......... *H01L 24/09* (2013.01); *H01L 21/76898* (2013.01); *H01L 23/481* (2013.01); *H01L 23/5386* (2013.01); *H01L 25/0657* (2013.01); *H01L 27/0688* (2013.01); *H01L 2224/02205* (2013.01); *H01L 2224/0905* (2013.01); *H01L 2225/06544* (2013.01); *H01L 2924/0002* (2013.01); *H01L 2924/14* (2013.01); *H01L 2924/3701* (2013.01)

(58) Field of Classification Search
CPC ........... H01L 2225/06541; H01L 2225/06544; H01L 21/76816; H01L 21/76804

USPC .................................................. 438/667, 109
See application file for complete search history.

(56) References Cited

U.S. PATENT DOCUMENTS

| | | | | |
|---|---|---|---|---|
| 4,499,655 A | * | 2/1985 | Anthony ........................ | 438/109 |
| 7,022,600 B2 | * | 4/2006 | Kim et al. ..................... | 438/623 |
| 7,858,439 B2 | * | 12/2010 | Kim .............................. | 438/109 |
| 8,129,833 B2 | * | 3/2012 | Kang et al. .................... | 257/686 |
| 8,319,327 B2 | * | 11/2012 | Suh ............................... | 257/686 |
| 8,633,099 B1 | * | 1/2014 | Shih .................... | H01L 21/76805 257/758 |
| 8,664,761 B1 | * | 3/2014 | Hu ..................... | H01L 27/11519 257/698 |
| 8,765,598 B2 | * | 7/2014 | Smith ............... | H01L 27/11548 257/700 |
| 2001/0046783 A1 | * | 11/2001 | Furusawa et al. ............. | 438/736 |
| 2004/0067634 A1 | * | 4/2004 | Kim et al. ..................... | 438/622 |
| 2006/0134905 A1 | * | 6/2006 | Barwicz et al. ............... | 438/618 |

(Continued)

FOREIGN PATENT DOCUMENTS

WO  WO 2013100709 A1 * 7/2013 .............. H01L 23/12

*Primary Examiner* — David Zarneke

(74) *Attorney, Agent, or Firm* — Yuanmin Cai; Hoffman Warnick LLC

(57) ABSTRACT

Circuits incorporating three-dimensional integration and methods of their fabrication are disclosed. One circuit includes a bottom layer and a plurality of upper layers. The bottom layer includes a bottom landing pad connected to functional components in the bottom layer. In addition, the upper layers are stacked above the bottom layer. Each of the upper layers includes a respective upper landing pad that is connected to respective functional components in the respective upper layer. The landing pads are coupled by a single conductive via and are aligned in a stack of the bottom layer and the upper layers such that each of the landing pads is offset from any of the landing pads in an adjacent layer in the stack by at least one pre-determined amount.

17 Claims, 10 Drawing Sheets

(56) References Cited

U.S. PATENT DOCUMENTS

| | | | |
|---|---|---|---|
| 2008/0008490 A1* | 1/2008 | Sanmonji | 399/71 |
| 2008/0230923 A1* | 9/2008 | Jo et al. | 257/777 |
| 2008/0280436 A1* | 11/2008 | Wang | 438/675 |
| 2009/0014891 A1* | 1/2009 | Chang et al. | 257/777 |
| 2009/0230458 A1* | 9/2009 | Ishiduki et al. | 257/324 |
| 2010/0109164 A1* | 5/2010 | Kang | H01L 21/76898 257/774 |
| 2010/0133697 A1* | 6/2010 | Nilsson | 257/774 |
| 2010/0193964 A1 | 8/2010 | Farooq et al. | |
| 2011/0065270 A1* | 3/2011 | Shim et al. | 438/589 |
| 2011/0076819 A1* | 3/2011 | Kim et al. | 438/279 |
| 2011/0151667 A1* | 6/2011 | Hwang et al. | 438/667 |
| 2012/0181698 A1* | 7/2012 | Xie et al. | 257/770 |
| 2012/0270733 A1* | 10/2012 | Cush et al. | 504/100 |
| 2013/0264688 A1* | 10/2013 | Qian | H01L 21/76898 257/622 |
| 2013/0277852 A1* | 10/2013 | Chen | H01L 21/6835 257/774 |
| 2014/0054789 A1* | 2/2014 | Chiu | H01L 27/1052 257/774 |
| 2014/0264925 A1* | 9/2014 | Chen | H01L 21/76816 257/774 |

* cited by examiner

VIA STRUCTURE FOR THREE-DIMENSIONAL CIRCUIT INTEGRATION

BACKGROUND

1. Technical Field

The present invention relates to integrated circuits, and more particularly to via structures and methods of their fabrication.

2. Description of the Related Art

Three-dimensional integration (3Di) is an emerging technology that enables the manufacture of vertically stacked integrated systems and functional components, such as processors, memory, sensors, etc. There are many advantages of such an integration approach, including, among other benefits, a small form factor, simplified heterogeneous integration and multifunctional designs, reduced packaging, lower power consumption, lower cost and shorter design-to-market times.

In typical 3Di schemes, the vertical integration of two different systems including functional components, such as chips, packages, wafers, etc., is performed by bonding the two systems to each other and then defining and creating vias filled with electrically conductive material in a massively parallel fashion in order to establish a reliable electrical connection between the aligned functional components of the two systems, as needed. This electrical interconnection can be achieved by forming through-silicon via (TSV) structures. Here, for each pair of vertically aligned functional components, two vias are defined from the top of the bonded systems structure. This is done so that one via lands on a predefined landing pad on the first/top component and another via lands on a predefined landing pad on the second/bottom component. Subsequently, an electrical connection strap is defined, as needed, in order to connect the two vias and thereby connect the two functional components.

SUMMARY

One embodiment of the present principles is directed to a circuit incorporating three-dimensional integration. The circuit includes a bottom layer and a plurality of upper layers. The bottom layer includes a bottom landing pad connected to functional components in the bottom layer. In addition, the upper layers are stacked above the bottom layer. Each of the upper layers includes a respective upper landing pad that is connected to respective functional components in the respective upper layer. The landing pads are coupled by a single conductive via and are aligned in a stack of the bottom layer and the upper layers such that each of the landing pads is offset from any of the landing pads in an adjacent layer in the stack by at least one pre-determined amount.

Another embodiment is directed to a wafer multi-stack component incorporating three-dimensional integration. The component includes a bottom wafer and a plurality of upper wafers. The bottom wafer includes a bottom landing pad connected to functional components in the bottom wafer. The upper wafers are stacked above the bottom wafer. Further, each of the upper wafers includes a respective upper landing pad that is connected to respective functional components in the respective upper wafer. The landing pads are coupled by a single conductive via and the upper landing pads are aligned in a spiral configuration.

An alternative embodiment is directed to an integrated circuit incorporating three-dimensional integration. The circuit includes a lower layer and at least one upper layer. The lower layer includes a lower landing pad connected to functional components in the lower layer. In addition the upper layer(s) is stacked above the lower layer. Each upper layer includes a respective upper landing pad that is connected to respective functional components in the respective upper layer. The landing pads are coupled by a single conductive via in a stack formed by the lower layer and the upper layer(s). Each of the landing pads includes a respective protective coating. Further, thicknesses of the protective coatings may progressively increase from the protective coating of the lower landing pad to the protective coating of the upper landing pad in the top upper layer of the upper layers in the stack, depending on the etching selectivity of the protective layer used.

Another embodiment is directed to a method for implementing three-dimensional integration of functional components of a circuit. In accordance with the method, an upper layer is aligned over an adjacent, lower layer during bonding of the upper and lower layers such that a landing pad disposed on the upper layer is offset from a landing pad disposed on the lower layer. The layers are etched through to form a via hole in the layers and to expose the landing pads. The via hole is filled with a conductive material to form a via that couples the landing pads of the upper and lower layers.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
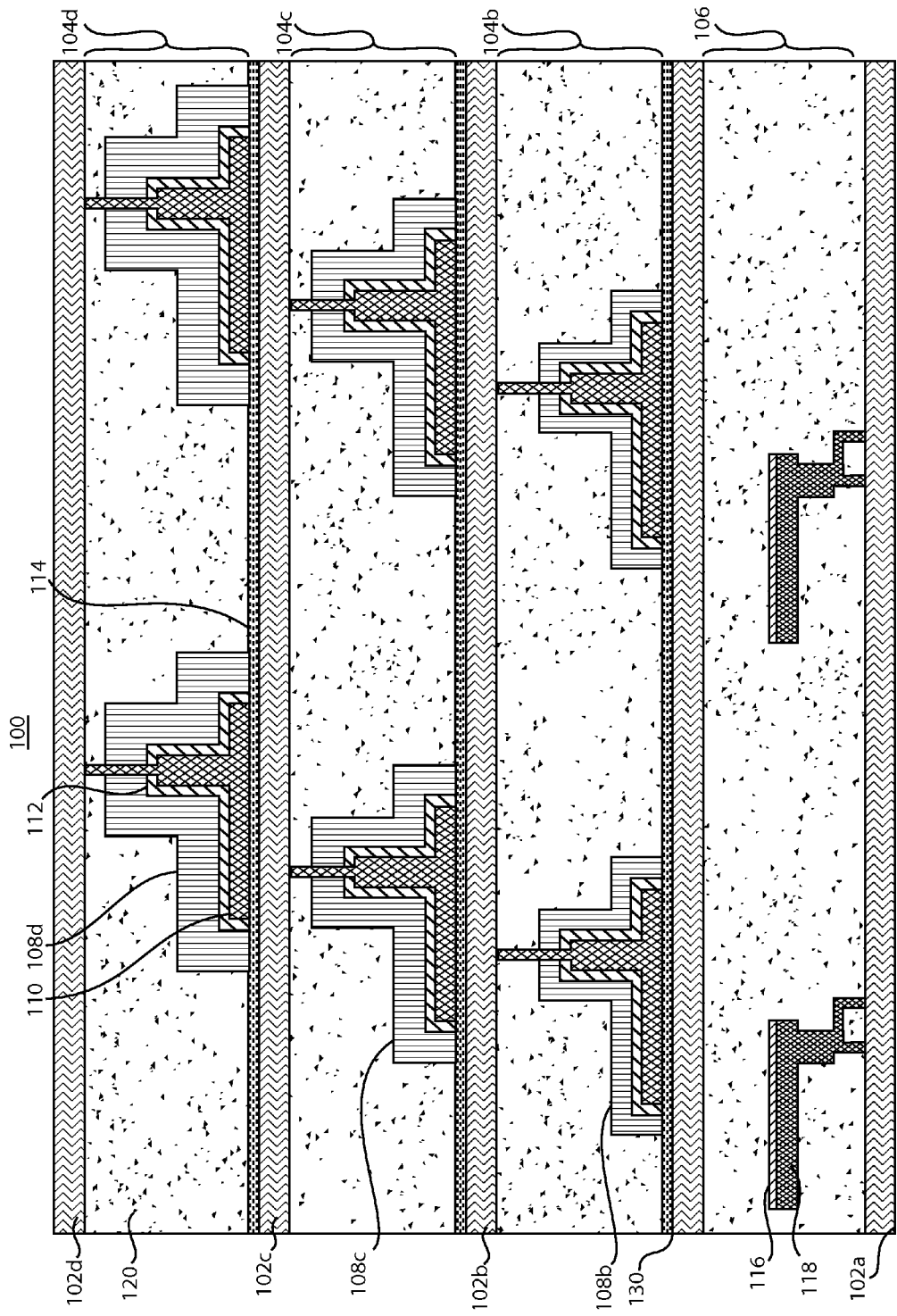
FIG. 1 is a cross-sectional view of a wafer multi-stack in accordance with an exemplary embodiment.

As stated above, schemes for integrating functional components in 3Di integrated circuits involve a relatively large number of processing steps, which include implementing a plurality of different vias and electrical connection straps to connect the various functional components. Embodiments of the present principles utilize an elegant scheme to reduce the number of processing steps by using a structure whereby a plurality of TSVs are defined jointly as a single "merged" TSV. In particular, the landing pads of a bottom wafer and a plurality of upper wafers can be staggered vertically to permit a via to form an effective electrical connection to each of the wafers simultaneously. The structure of the landing pads would enable the direct electrical connection between the multiple functional components when the TSV is filled with electrically conductive materials. For example, the arrangement of the landing pads can be in a spiral staircase structure, among other structures, to permit a single via to contact each of the landing pads over relatively large surface areas. The landing pad structure eliminates the need for a separate definition of a connecting strap. In this case, the landing pads for the bottom and top systems are aligned in such a way that a single, possibly wider, via can be defined for each pair of functional components so that an electrical connection between the functional components can be made when the TSV is filled with electrical conductive materials.

Furthermore, depending on the vertical positioning of the landing pads, encapsulating films of potentially varying thicknesses can be applied to the landing pads to facilitate the formation of a proper electrical connection. For example, when the TSV is etched by the use of reactive ion etching or other etching methods, the landing pads situated towards the top of the vertical stack of components would be exposed to the etching materials at extreme conditions for a longer duration than the landing pads disposed toward the bottom of the stack. Thus, to protect the landing pads from damage during the etching stage, encapsulating layers that erode at a predetermined rate can be applied over the landing pads with varying thicknesses to ensure that the etching material and conditions reach each of landing pads in a simultaneous fashion. The benefits are multiplied if a design/process combination permits multiple stacking of wafers that can all be connected through a single TSV that is formed on suitable landing pads on all wafers at the same time.

It should be understood that aspects of the present invention are described below with reference to flowchart illustrations and/or block diagrams of methods, apparatus (systems) and devices according to embodiments of the invention.

The flowchart and block diagrams in the Figures illustrate the architecture, functionality, and operation of possible implementations of systems, methods and devices according to various embodiments of the present invention. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that blocks of the block diagrams and/or flowchart illustration, and combinations of blocks in the block diagrams and/or flowchart illustration, can be implemented by special purpose hardware-based systems that direct the specified functions or acts.

It is to be understood that the present invention will be described in terms of a given illustrative architecture having a wafer; however, other architectures, structures, substrate materials and process features and steps may be varied within the scope of the present invention.

It will also be understood that when an element described as a layer, region or substrate is referred to as being "on" or "over" another element, it can be directly on the other element or intervening elements may also be present. In contrast, when an element is referred to as being "directly on" or "directly over" another element, there are no intervening elements present. Similarly, it will also be understood that when an element described as a layer, region or substrate is referred to as being "beneath" or "below" another element, it can be directly beneath the other element or intervening elements may also be present. In contrast, when an element is referred to as being "directly beneath" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip or chips in accordance with the principles described herein may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

As indicated above, in accordance with the present principles, alignment offsets can be employed during wafer bonding to line up the TSV landing pads on the various wafers in a staggered configuration, such as a "spiral staircase" configuration, to enable the formation of a single TSV connection from the top of the wafer stock to the bottom of the wafer stack with the smallest possible TSV diameter. As also noted above, the multiple connection can be made during a single TSV formation by using protective layers on the landing pads that have a variable thickness, depending on the wafer stratum in which the layers are applied. The thicknesses of the protective layers are selected so that each "step" on the staggered configuration is reached at the end of the etch simultaneously. The approach described herein considerably reduces the number of processing steps applied to integrate a plurality of functional components in an integrated circuit.

Referring now to the drawings in which like numerals represent the same or similar elements and initially to FIG. 1, a diagram of a stack of wafers 100 in accordance with an exemplary embodiment is illustratively depicted. The stack of wafers 100 are shown in an intermediate processing step during the formation of the integrated circuit. Thus, the stack 100 can be part of a larger stack that includes other layers that are above and/or below the stack 100. As such, reference herein to a top layer and/or a bottom layer of the stack 100 need not correspond to the top and/or bottom layer of the larger stack.

The stack 100 includes upper wafers 102b, 102c and 102d, each of which is comprised of a semiconductor material, such as silicon. In addition, the stack further includes a bottom wafer 102a, which is also comprised of a semiconductor material, such as silicon. At this point, each wafer may already have functional components, such as memory, logic, etc., connected on the respective wafer. In addition, each wafer may have a plurality of layers of metal interconnects. It should be noted that, although four wafers are described here for illustrative purposes, the number of wafers in the stack 100 can be varied. Furthermore, the orientations of each of the wafers and/or the types of wafers employed may also be varied. In the particular example provided in FIG. 1, the bottom wafer 102a is oriented face up while the top wafers 102b, 102c and 102d are oriented face down. However, other combinations for bonding, such as face-to-face, face-to-back, and combinations thereof, can be used. The wafers can be bonded by use of known permanent wafer bonding techniques, such as silicon direct bonding, oxide fusion bonding, metal-metal bonding, adhesive bonding, surface-activated bonding, etc. Once the bonding layers on two different wafers are prepared, the wafers can be aligned to each other and bonded with any appropriate technique for bonding the wafers typically known to those of ordinary skill in the art.

In the stack 100, components can be formed on the respective wafers. For example, layers including electrically conductive coupling components 104b, 104c and 104d are formed on or in the upper wafers 102b, 102c and 102d, respectively, while a layer including electrically conductive coupling components 106 is formed on or in the bottom wafer 102a. These components can preferably be formed at the topmost interconnect level for each wafer. Alternatively, they can be formed at lower interconnect levels. Each of the upper coupling components 104b, 104c and 104d include a conductive landing pad 110, which can be comprised of a metal, such as copper, and the coupling components 106 can include a conductive landing pad 118, which can also be comprised of a metal, such as copper. Other suitable materials for the landing pads 110 and 118 include aluminum (Al), gold (Au), tungsten (W), titanium nitride (TiN), tantalum (Ta), tantalum nitride (TaN), and in general any elemental or compound material and combination thereof that is electrically conductive and is compatible with the process flow employed, as known to those of ordinary skill in the art. Each of the landing pads are coupled to functional components of the circuit that are formed on or in its respective wafer. The lateral dimensions of the landing pads can be from about 0.1 micron to 100 microns or even larger if so desired. The majority of applications should employ lateral dimensions below 50 microns. In addition, a protective layer 114, which can be composed of a nitrogen-doped silicon carbide (NBLOK) film, can be provided beneath each of the landing pads 110. Similarly, a protective layer 116, which can also be composed of an NBLOK film, can be provided on the landing pad 118. The protective layers 114 and 116 can alternatively be composed of silicon nitride, silicon carbide, and in general any elemental or compound material and combination thereof that is known to possess sufficient selective resistance to the etching process when compared to the etching resistance of the silicon and/or silicon oxide materials that are actually etched to form the TSV/vias, as known to those of ordinary skill in the art. Further, an encapsulating layer 112, which can be a TaN film, can be formed on each of the upper landing pads 110. The wafer thicknesses can range from a full thickness silicon wafer or wafer stack (if so desired), which is about 775 microns per full-thickness wafer, to about ~2 microns for wafers that have been thinned to a large degree. A majority of applications should employ thicknesses of below 100 microns for the thinned upper wafers.

As indicated above, protective layers of varying thicknesses can be applied to the landing pads so that a TSV reaches the landing pads in a simultaneous fashion, thereby ensuring that a proper connection can be made. In particular, the landing pad protective layers are progressively thicker from the bottom of the stack to the top of the stack. Here, protective layers 108d, 108c and 108b that serve this purpose can be applied to the landing pads 110 of wafers 102d, 102c and 102b, respectively. As illustrated in FIG. 1, the thickness of the layer 108d is greater than the thickness of the layer 108c, which in turn is greater than the thickness of the layer 108b. For example, layer 108d can have a thickness of ~3000 Angstroms above layer 112, layer 108c can have a thickness of ~2000 Angstroms above layer 112 and layer 108b can have a thickness of ~1000 Angstroms above layer 112. Encapsulating layers 108d, 108c and 108b erode at a pre-determined rate and can be applied over the landing pads with varying thicknesses to ensure that the etch material and conditions of the TSV reaches each of the landing pads 110 and 118 simultaneously when applied from the top of the stack 100. Here, the protective layer can be composed of a silicon nitride film. Alternatively, the protective layers can be composed of NBLOK films, silicon carbide, and in general any elemental or compound material and combination thereof that is known to possess sufficient selective resistance to the etch process when compared to the resistance of the silicon and/or silicon oxide materials that are actually etched to form the TSV/vias, as known to those of ordinary skill in the art. It should also be noted that if the erosion rate for the materials used for 108b, 108c, and 108d is very low compared to silicon and silicon oxide (for example using a metal hardmask), they can all have the same thickness. Thus, the thicknesses of the protective layers can be dependent upon on the etching selectivity of the protective layers used. The landing pads and their associated protective layers are separated by a dielectric 120, for example, of an oxide material, as illustrated in FIG. 1.

As illustrated in FIG. 1, a step-like alignment of landing pads 110 and 118 on different wafers 102a-102d is implemented to enable a single TSV drill and formation. The step-like alignment can be implemented during bonding between the wafers by the use of offsets. The alignment should utilize the full X-Y alignment spectrum. In accordance with one exemplary embodiment, each of the wafers 102b, 102c and 102d can be configured so that the location of the landing pads 110 are at approximately the same position on their respective wafers. Thus, during the bonding between the wafers 102a-102d, the wafers themselves are offset appropriately to align the landing pads in a step-like structure.

It should be noted that the alignment of landing pads can be implemented in accordance with a variety of step-like configurations. For example, with reference now to FIGS. 2-5, top-down views of several possible step-like alignment configurations 200, 300, 400 and 500 of landing pads that can be implemented in the stack 100 are illustratively depicted. Each of the configurations have varying degrees of benefits and advantages, as described further herein below. Generally, the landing pads are aligned so that they create a "staircase" structure that progressively shifts outward from the bottom of the stack to the top of the stack. In each configuration, a TSV can be formed and can touch down on all landing pads simultaneously. Prior to discussing the configurations in detail it should be noted that each of the landing pads 202-214 in FIGS. 2-5 are disposed on different, respective wafers in a stack and are situated at different heights in the stack. In each of the FIGS. 2-5, the wafers (not shown) on which the landing pads are formed are stacked successively to implement the staggered alignment.

Figures 2, 3, 4, 5:
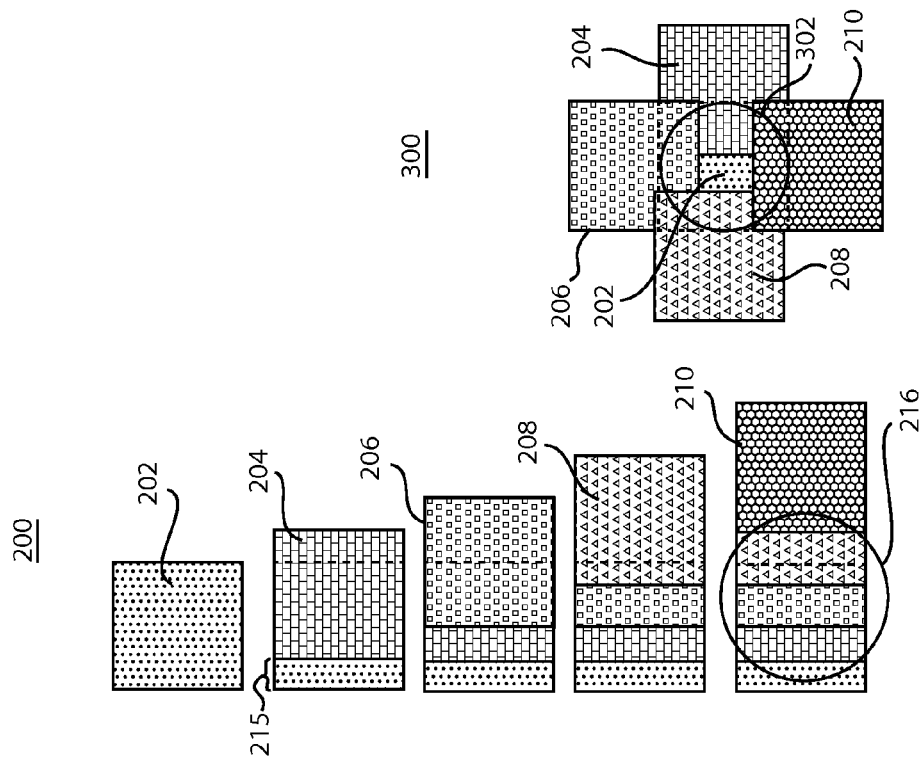
FIG. 2 is a top-down view of a configuration of landing pads in accordance with an exemplary one-directional offset scheme.
FIGS. 3-5 are top-down views of a plurality of different configurations of landing pads in accordance with exemplary spiral offset schemes.

In the configuration 200 of FIG. 2, a serial one-directional offset scheme is utilized. For example, each row of landing pads in FIG. 2 illustrates a view of the landing pads after a different wafer is added to the stack. For example, landing pad 202 is disposed on the bottom wafer of the stack. Subsequently, as illustrated in the second row of FIG. 2 (counting from the top down), the wafer on which landing pad 204 is formed is stacked on and bonded to the wafer on which the landing pad 202 is formed. As shown in the second row, the stacking and alignment is implemented such that the edge of the landing pad 204 is offset by a distance 215 from the edge of the landing pad 202. Similarly, as illustrated in row three of FIG. 2, the wafer on which landing pad 206 is formed is stacked on and bonded to the wafer on which the landing pad 204 is formed such that the landing pad 206 is offset from the edge of the landing pad 204. Similarly, the wafers of landing pads 208 and 210 are stacked and bonded so that the landing pads are successively offset from the landing pads below them, as illustrated in FIG. 2, thereby forming a serial one-directional offset staircase configuration. Area 216 illustrates the location at which the TSV will be formed. As depicted in FIG. 2, the TSV will be capable of contacting and forming a connection with each of the landing pads 202-210.

Referring now in particular to FIG. 3, a configuration 300 formed in accordance with an East-North-West-South ('ENWS') staircase scheme is illustratively depicted. Similar to FIG. 2, the wafer on which landing pad 204 is disposed is bonded to and situated above the wafer on which landing pad 202 is disposed, the wafer on which landing pad 206 is disposed is bonded to and situated above the wafer on which landing pad 204 is disposed, the wafer on which landing pad 208 is disposed is bonded to and situated above the wafer on which landing pad 206 is disposed and the wafer on which landing pad 210 is disposed is bonded to and situated above the wafer on which landing pad 208 is disposed. However, here, the wafers are configured and aligned such that the landing pad 202 is provided in a central position, the landing pad 204 is situated in a right or eastward position, the landing pad 206 is situated in a top or northward position, the landing pad 208 is situated in a left or westward position, and the landing pad 210 is situated in a bottom or southward position. Further, area 302 illustrates the location at which the TSV will be formed. Here, an advantage of the ENWS configuration over the serial one-directional offset scheme is that the TSV can be configured with a smaller diameter. In other words, area 302 can be configured to be smaller than the area 216, However, implementing the alignment of the landing pads in accordance with the serial one directional offset scheme of FIG. 2 may be less complex than aligning the landing pads in accordance with the ENWS configuration.

With reference to FIG. 4, a configuration 400 formed in accordance with a spiral staircase scheme is illustratively depicted. Similar to FIGS. 2 and 3, the wafer on which landing pad 206 is disposed is bonded to and situated above the wafer on which landing pad 202 is disposed, the wafer on which landing pad 208 is disposed is bonded to and situated above the wafer on which landing pad 206 is disposed, the wafer on which landing pad 210 is disposed is bonded to and situated above the wafer on which landing pad 208 is disposed, the wafer on which landing pad 204 is disposed is bonded to and situated above the wafer on which landing pad 210 is disposed and the wafer on which landing pad 212 is disposed is bonded to and situated above the wafer on which landing pad 204 is disposed. However, the landing pads in the configuration 400 are aligned to form a spiral staircase configuration in which additional landing pads/wafers can be connected with a common TSV, which is to be disposed in the area 402. Here, the landing pads of the spiral staircase configuration are offset outwards from the bottom of the stack to the top of the stack to minimize the width of the TSV that connects all landing pads. In accordance with this configuration, the same via contact area can be applied for all pads; the connecting area for each pad can be configured so that it exceeds any minimum area imposed by design for sufficient electrical contact. FIG. 5 also illustrates a spiral staircase configuration 500 that has an additional wafer (as compared to FIG. 4) with its associated landing pad 214. However, here, the diameter of the area 502 at which the TSV is to be disposed is larger than the diameter of the area 402 to ensure that all landing pads 202-214 in the configuration 500 maintain a sufficient connectivity with the TSV. Although the diameter of the area 502 is equal to that of area 216 of FIG. 2, the area 502 makes contact on more landing pads than the contact area 216 in the configuration of FIG. 2, thus illustrating the advantages of using a spiral staircase approach.

With reference now to FIGS. 6-10, stages of an etching and via formation process in accordance with an exemplary embodiment is illustratively depicted. In particular, for expository purposes, the FIGS. 6-10 illustrate etching and via formation in the stack 100 of FIG. 1. In the etching illustrated in FIGS. 6-9, lithographic patterning methods can used by applying a photosensitive resist on the surface and using optical lithography to define the area over where the via is to be etched by use of a positive or negative photoresist. After lithographic development, the area to be etched is exposed and the etching of the via begins, while the rest of the surface is protected by the photoresist. Examples of etch processes that can be used includes the Bosch process for deep silicon and oxide reactive-ion etching (RIE) and other deep reactive ion etch processes that are not cyclical as the Bosch process but are directional vertically and anisotropic. Such processes are known to those of ordinary skill in the art of defining TSVs. This can be a single type of such an etch process or a combination of more of such processes, as needed or desired.

Figure 6:
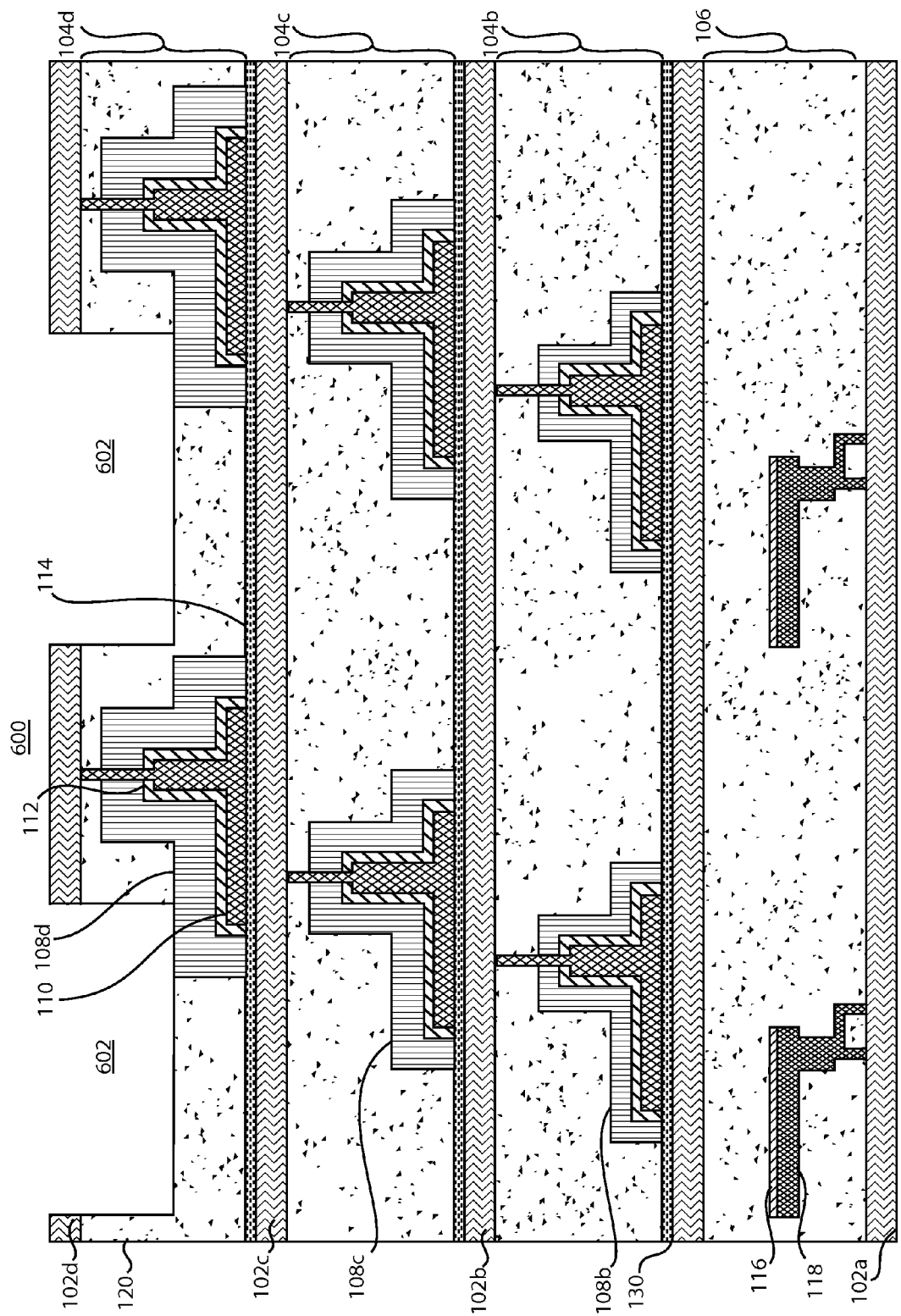
FIGS. 6-9 are cross-sectional views of a wafer multi-stack during various etching stages in accordance with an exemplary embodiment.
Figure 7:
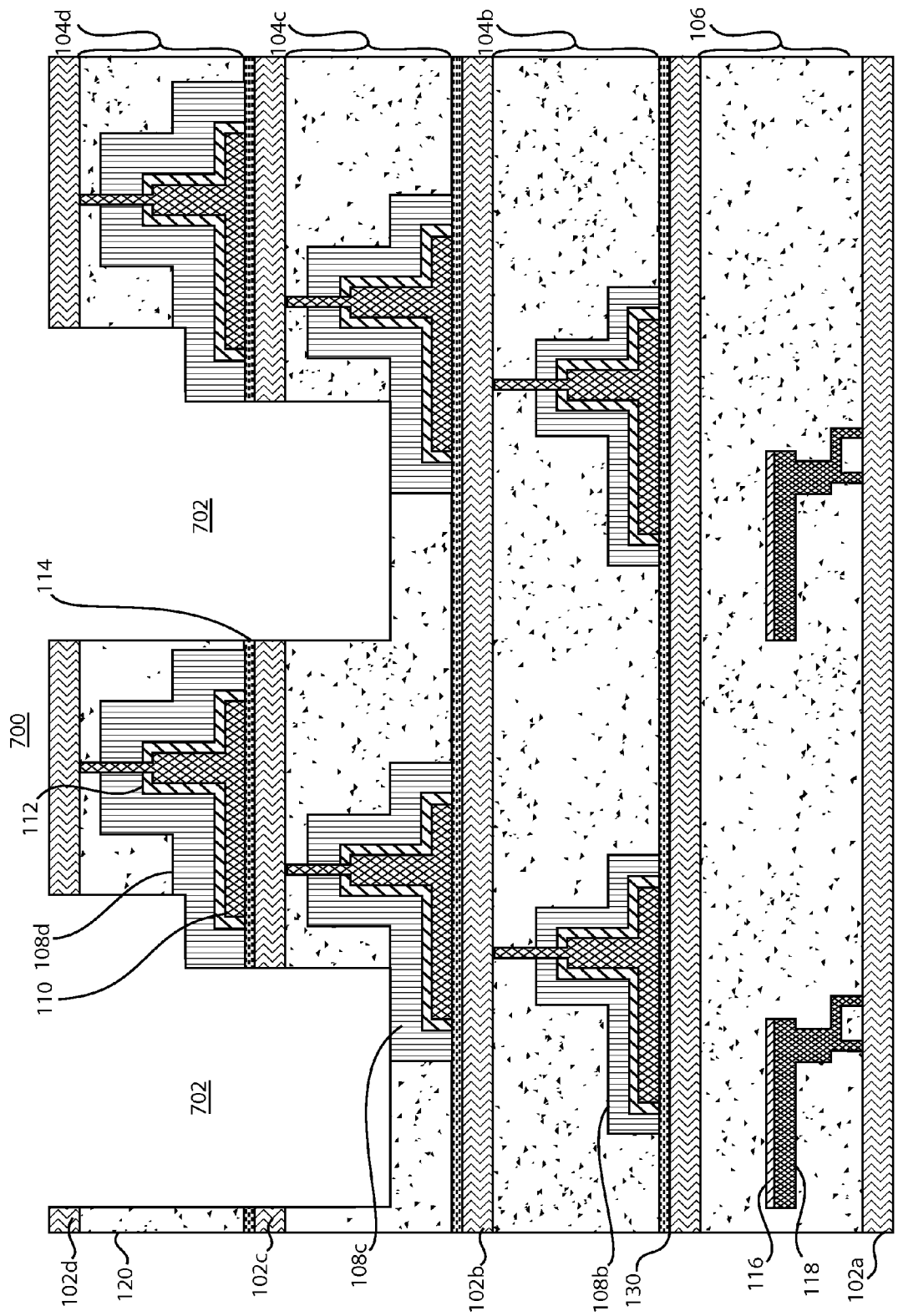
Figure 8:
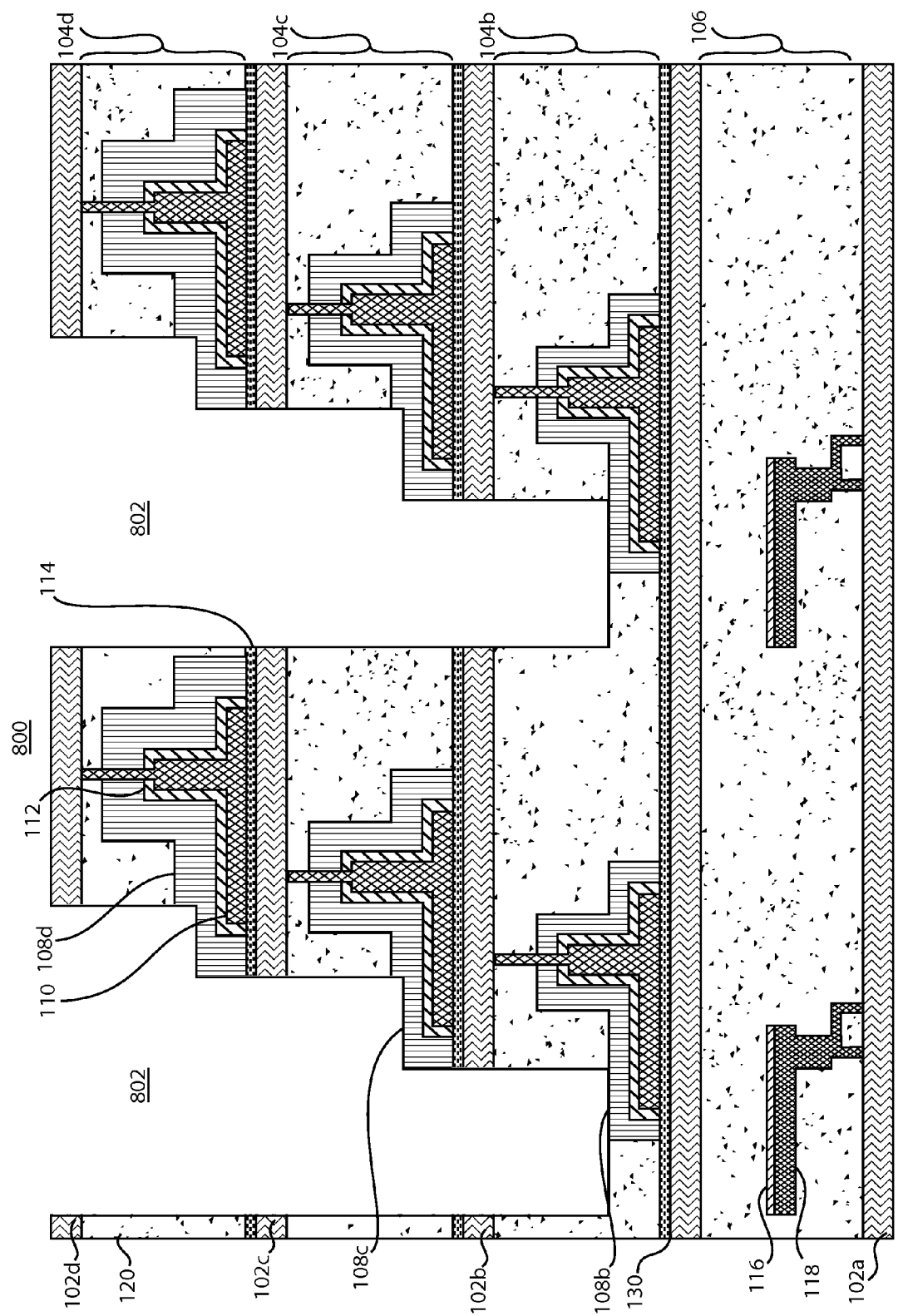
Figure 9:
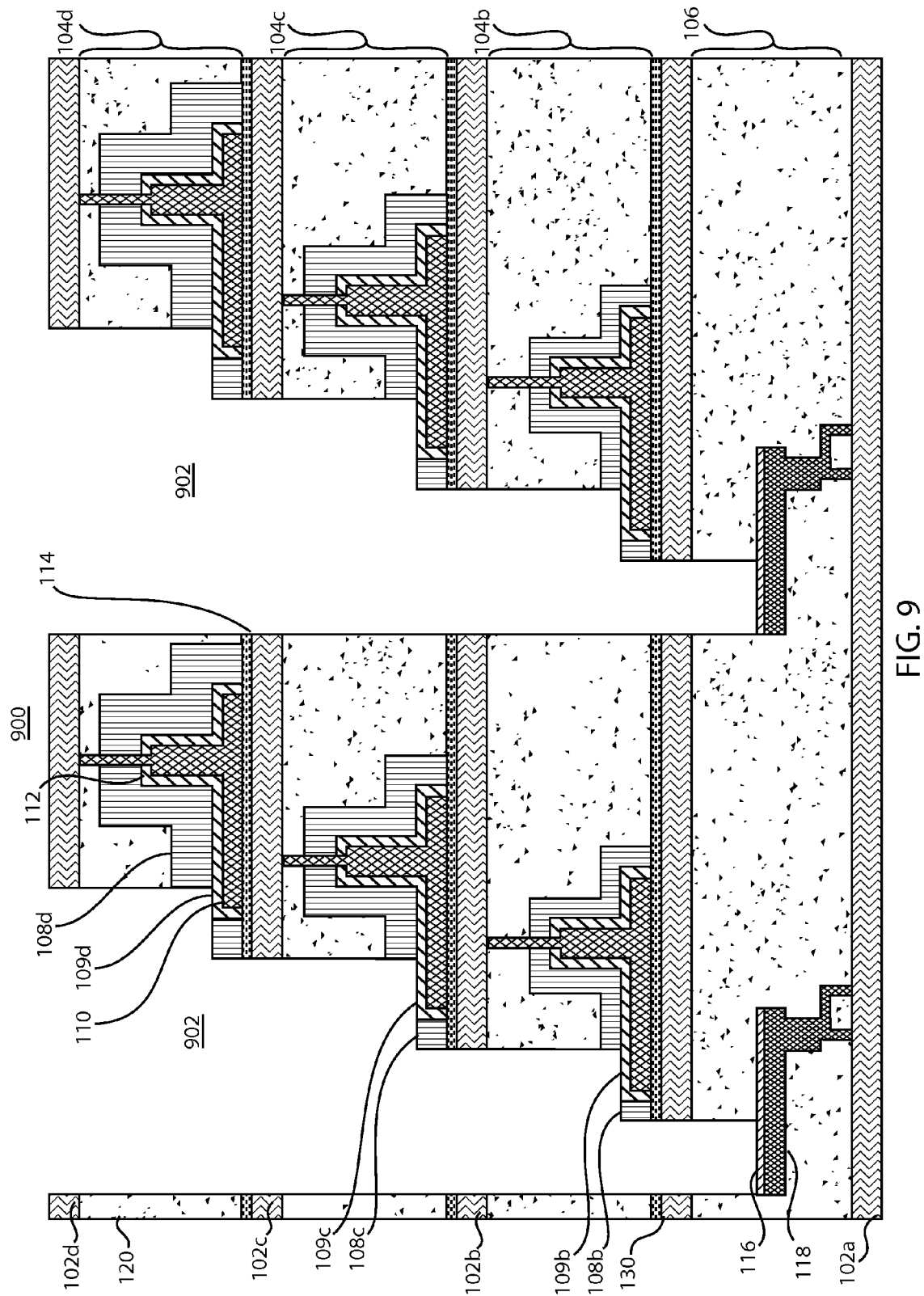

As shown in structure 600 of FIG. 6, the semiconductor and dielectric of the top of the wafer 102$d$ is etched to reach the protective layer(s) of the top-most landing pad 110, thereby forming via holes 602. Thereafter, the etching is continued to form via holes 702, where the protective layer 108$d$ of the landing pad 110 of the wafer 102$d$ is partially eroded and the protective layer 108$c$ of the landing pad 110 of the wafer 102$c$ is reached, as shown in structure 700 of FIG. 7. In addition, as illustrated in structure 800 of FIG. 8, the etching progresses to form via holes 802, where the protective layer 108$d$ is further eroded, the protective layer 108$c$ is partially eroded, and the protective layer 108$b$ of the landing pad of the wafer 102$b$ is reached. Further, as shown in structure 900 of FIG. 9, the etching continues to form via holes 902. Here, the protective layers 108$d$, 108$c$ and 108$b$ of the landing pads 110 of the upper wafers 102d, 102c and 102b are completely eroded above the areas of the landing pads 110 on which the TSV will be formed. In particular, the protective layers 108d, 108c and 108b are completely eroded above the areas of the landing pads 110 on which the TSV will be formed in a simultaneous fashion. In addition, the layer 116 of the landing pad 118 of the bottom-most wafer 102a is reached simultaneously with the complete erosion of layers 108d, 108c and 108b, as illustrated in FIG. 9. As such, the layers encapsulating the conductive landing pad, which can be composed of, for example, copper, are revealed. The encapsulating layers that are reached by the etch can include a metal liner and/or an NBLOK layer. A metal liner can be disposed between the layer 112 and 110 and/or a metal liner can be disposed between layers 116 and 118 in accordance with exemplary aspects. The deep RIE process(es) continues progressively throughout FIGS. 6-9 until the etch exposes the metallic landing pad structures, for example, by simultaneously reaching the metal liner and/or the diffusion barrier films protecting the metal in this embodiment. The etching illustrated in the embodiment of FIGS. 6-9 is equivalent to etching through about 1 to 10 microns of interlayer dielectric (such as tetra-ethyl-orthosilicate-based silicon oxide) and about 1 micron to about 30 microns of silicon (remaining silicon wafer thickness) per wafer. The typical etch selectivity of metal/nitride as compared to the oxide/silicon can range from 10-to-1 to 30-to-1.

Figure 10:
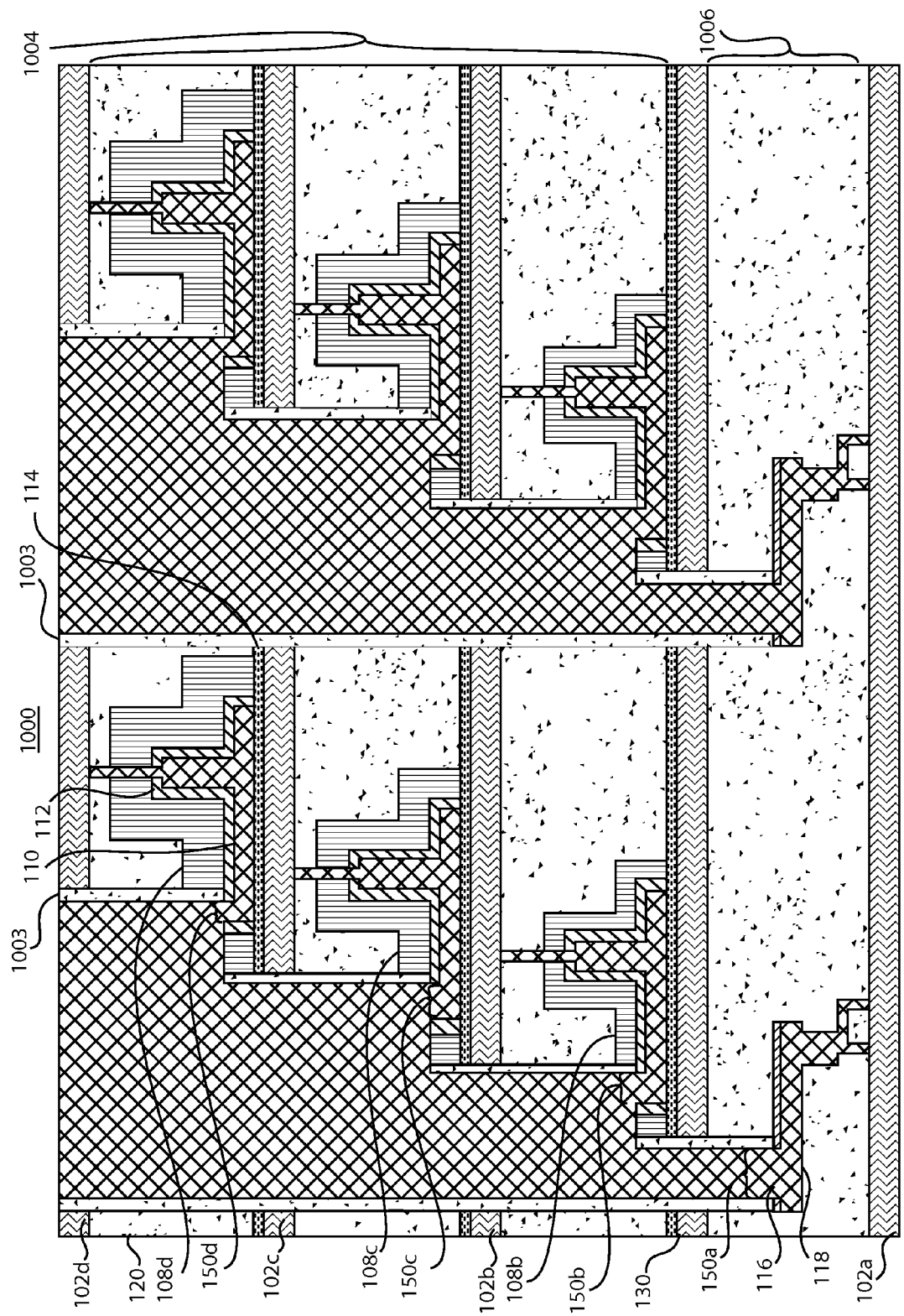
FIG. 10 is a cross-sectional view of a wafer multi-stack during a via filling stage in accordance with an exemplary embodiment.

Subsequently, as illustrated in FIG. 10, a dielectric liner 1003, for example, an oxide liner, can be deposited, followed by an anisotropic/directional etch to clear through the liner and diffusion barrier to the conductive pads 110, 118 in a manner such that the sidewall protective layer(s) survive the etch and protect against exposure of the conductive pads to sputtering. Here, the via hole can be lined with the insulating liner 1003, which can be silicon oxide, nitride, etc., by employing chemical vapor deposition (CVD), plasma-enhanced chemical vapor deposition (PECVD), atomic layer deposition (ALD), sub-atmospheric chemical vapor deposition (SACVD), or other suitable deposition techniques known to those of ordinary skill in the art. Then, a highly directional etch, such as the etch used for opening the via described above, can be used to break through the bottom layer of insulator liner and/or diffusion barrier layers to expose the metallic surface for the electrical connection. Alternatively, this dielectric liner can be deposited after etching to expose but not completely remove the protective layers 108b, 108c, and 108d. The highly directional etch would then break through the bottom layer of the insulator and any remaining protective layer.

Thereafter, deposition/filling of conductive material 1002, such as copper, for the TSV can be implemented by conventional means. For example, standard metallization techniques can be used for formation of the Cu liner, including, for example, Ta/TaN via CVD, PVD, or other Cu liner deposition techniques. Subsequently Cu seed deposition, such as, for example Cu or Ru deposition via PVD or via other deposition techniques, can be applied. Thereafter, standard Cu plating can be implemented to fill the via with metal, followed by Cu planarization through chemical mechanical polishing (CMP), which completes the multiple merged TSV metallization.

As illustrated in FIG. 10, the landing pads 110 of upper wafers 102b-102d and the landing pad 118 are coupled by a single conductive via. Here, the landing pads are aligned in a stack of the bottom layer and the upper layers such that each of the landing pads is offset from any of the landing pads in an adjacent layer in the stack by at least one pre-determined amount. For example, the landing pad 110 of the wafer 102c is offset by a predetermined amount from the landing pad 110 of the wafer 102d and is offset by a predetermined amount from the landing pad 110 of the wafer 102b, where each of the forgoing landing pads are coupled to the same via 1002. Similarly, the landing pad 118 is offset by a predetermined amount from the landing pad 110 of the wafer 102b, each of which is connected to the same via 1002.

Figure 11:
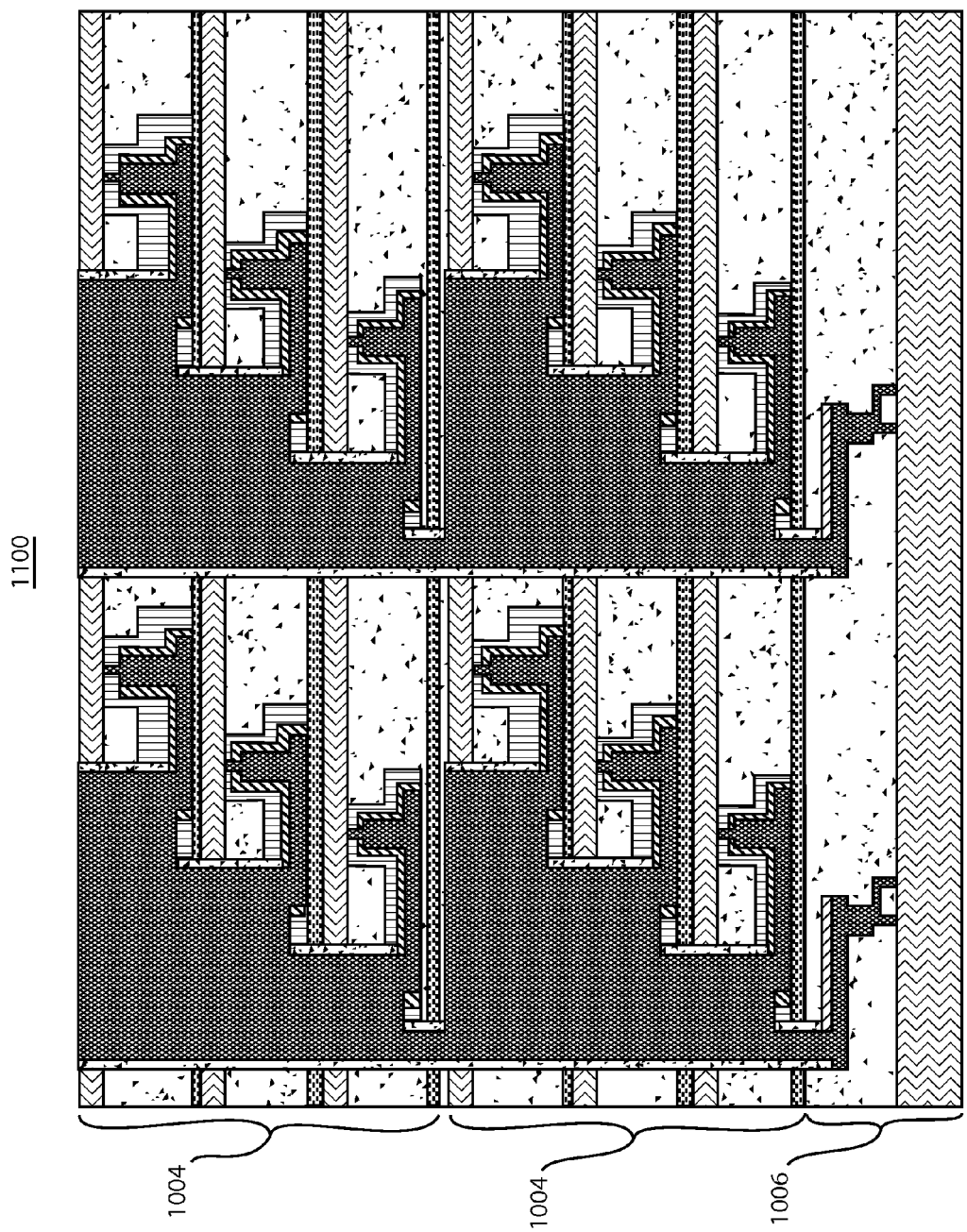
FIG. 11 is a cross-sectional view of a completed wafer multi-stack in accordance with an alternative exemplary embodiment.

It should be noted that the configuration of FIG. 10 can be extended. For example, the process can be repeated with a desired number of wafers per single multi-wafer TSV. For example, the process described above to form portion 1004 of FIG. 10 can be repeated so that a plurality of such portions 1004 can be formed, stacked and bonded, as shown in FIG. 11. Here, in the example depicted in FIG. 11, there are in general three-upper layers for each iteration of the process. The number of layers per iteration depends on limitations with respect to the thickness of protective layers and the desired via diameter.

If there are alignment performance issues with the final device 1000 or 1100, the TSV approaches described herein enables single TSV patterning real-time adaptation. For example, the single TSV patterning can be adapted based on stack alignment data feedback to lithography components in order to optimize the contact area of the connection between the TSV and the landing pads. Similar feedback can be provided during the bonding process, so that subsequent wafer bonding can change the offset of the landing pads in order to possibly contain potential misalignment errors in prior bonding operations for the stack bonding.

It should be further noted that the wafer multi-stack component 1000 of FIG. 10 and/or the wafer multi-stack component 1100 of FIG. 11 can be part of a larger integrated circuit. In addition, the components 1000 and/or 1100 can be produced and sold independently as modular units for the fabrication of an integrated circuit. Further, although wafers were used to describe the components 1000 and 1100, the use of wafers are merely examples of layers that can be employed to fabricate the integrated circuit components 1000 and 1100. For example, the wafer 102d, which can include the connection components 104d and the functional components (not shown) on the wafer 102d to which the landing pad 110 is coupled, is an example of a single "upper layer." Similarly, the wafers 102c and 102b, which can include their respective connection and functional components, are examples of "upper layers," while the wafer 102a, which can include landing pad 118 and functional components coupled thereto (not shown), is an example of a "bottom layer." As indicated above, the wafers of the components 1000 and 1100 can be the same; as such, the bottom layer and the upper layers need not be different and can be configured in the same manner in other embodiments.

Moreover, although the wafers 102a-102d are configured in accordance with the serial one-directional offset scheme of FIG. 2 described above, the wafers of the components 1000 and 1100 can be configured and aligned in accordance with the spiral schemes of FIGS. 3-5.

Figure 12:
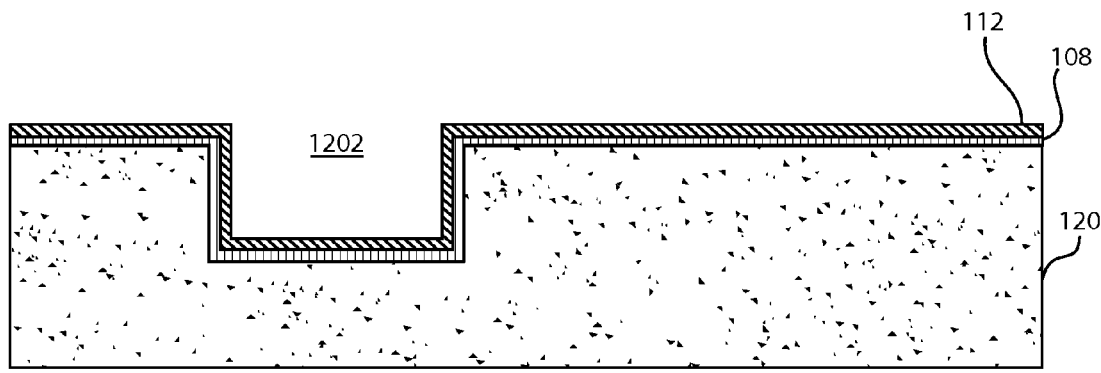
FIGS. 12-13 are cross-sectional views of a wafer during various etching stages in accordance with an exemplary embodiment.
Figure 13:
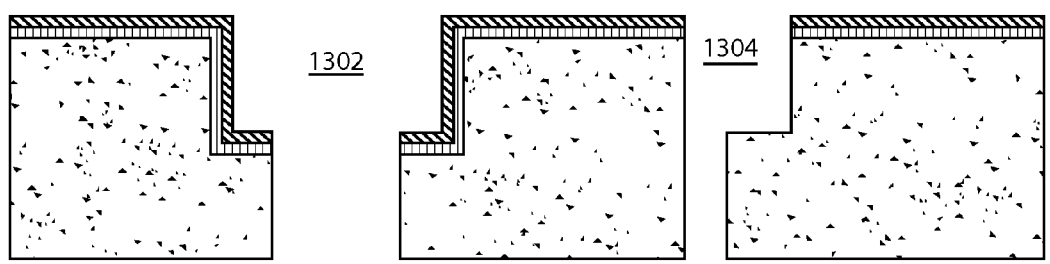
Figure 14:
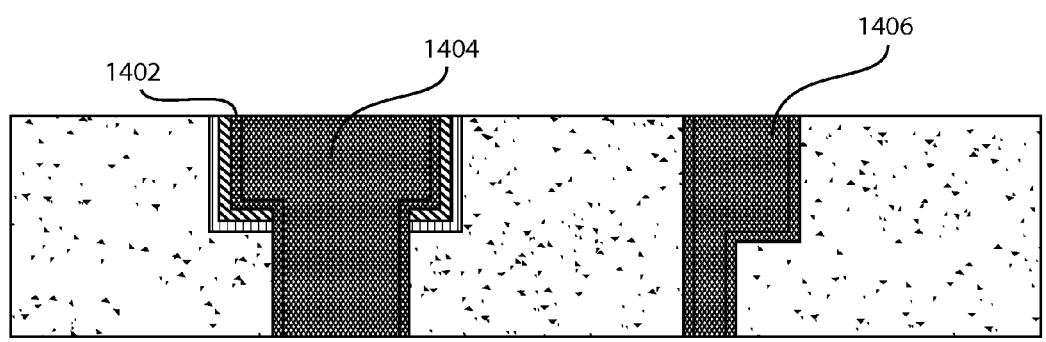
FIG. 14 is a cross-sectional view of a wafer during a via filling stage in accordance with an exemplary embodiment.

Reference is now made to FIGS. 12-14 to discuss a few points concerning the formation of the connection components 104b-104d of the wafers. FIG. 12 illustrates an exemplary wafer composed of a semiconductor (not shown), such as silicon, on which a dielectric 120, for example an oxide, has been formed. A landing pad trench 1202 is defined within the interlayer dielectric, which can be, for example, silicon oxide. As shown in FIG. 12, the landing pad trench 1202 can be formed, for example by lithographic patterning, followed by a dual encapsulation layer deposition. Lithographic patterning methods can be used by applying a photosensitive resist on the surface and by employing optical lithography to expose the area over where the pad is to be formed, as described earlier. The trench can be etched to the desired depth by means of etching, such as RIE, while the rest of the surface is protected by the photoresist. Subsequently, a dual encapsulation deposition can be implemented via CVD, PECVD, ALD, or other deposition techniques in order to deposit materials for the dual layer. Here, the dual layer can be composed of an encapsulating layer 108, for example a silicon nitride film, and an encapsulating layer 112, for example a TaN film. The materials for layers 108 and 112 can be the same as the encapsulation materials for landing pads 110 or 118 shown in FIGS. 1 and 6-11, as described above. As indicated above, the layer 108 can be configured to have a thickness in accordance with the vertical positioning of the associated landing pad in the stack, such as stack 100.

As illustrated in FIG. 13, lithographic patterning can be applied to define a level via/trench at trench 1304 and/or a via for a landing pad at trench 1302. The lithographic patterning can be similar to the patterning described above with regard to FIG. 12. However, in the case of FIG. 13, the patterning defines the via at the bottom of the landing pad trench. After patterning, etching, such as RIE, can be performed to drill this via. That step may be used to etch the trench for regular dual damascene trench/via interconnect circuitry that is on the same metallization level but not used for TSV connectivity. However, these features can also be formed using a standard separate litho patterning and etching process combination.

Further, with reference to FIG. 14, a metal liner 1402, such as TaN, Ta, etc., can be formed and seeding and filling can be performed to form the landing pads 1404 and metal trenches 1406. In addition, chemical mechanical planarization (CMP) can be applied. As noted above, these features are composed of a conductive material, such as copper. Here, metallization for the landing pad trench/via 1404 and the regular dual damascene feature 1406 described above is performed after the structures are defined. Specifically, in this embodiment, a copper liner is deposited in accordance with Ta/TaN via CVD, PVD, or other Cu liner deposition techniques, followed by Cu seed deposition in accordance with, for example, Cu or Ru deposition via PVD or other deposition techniques. Subsequently, Cu plating can be employed to fill the via/trench with metal, followed by Cu planarization implemented by applying CMP.

Figure 15:
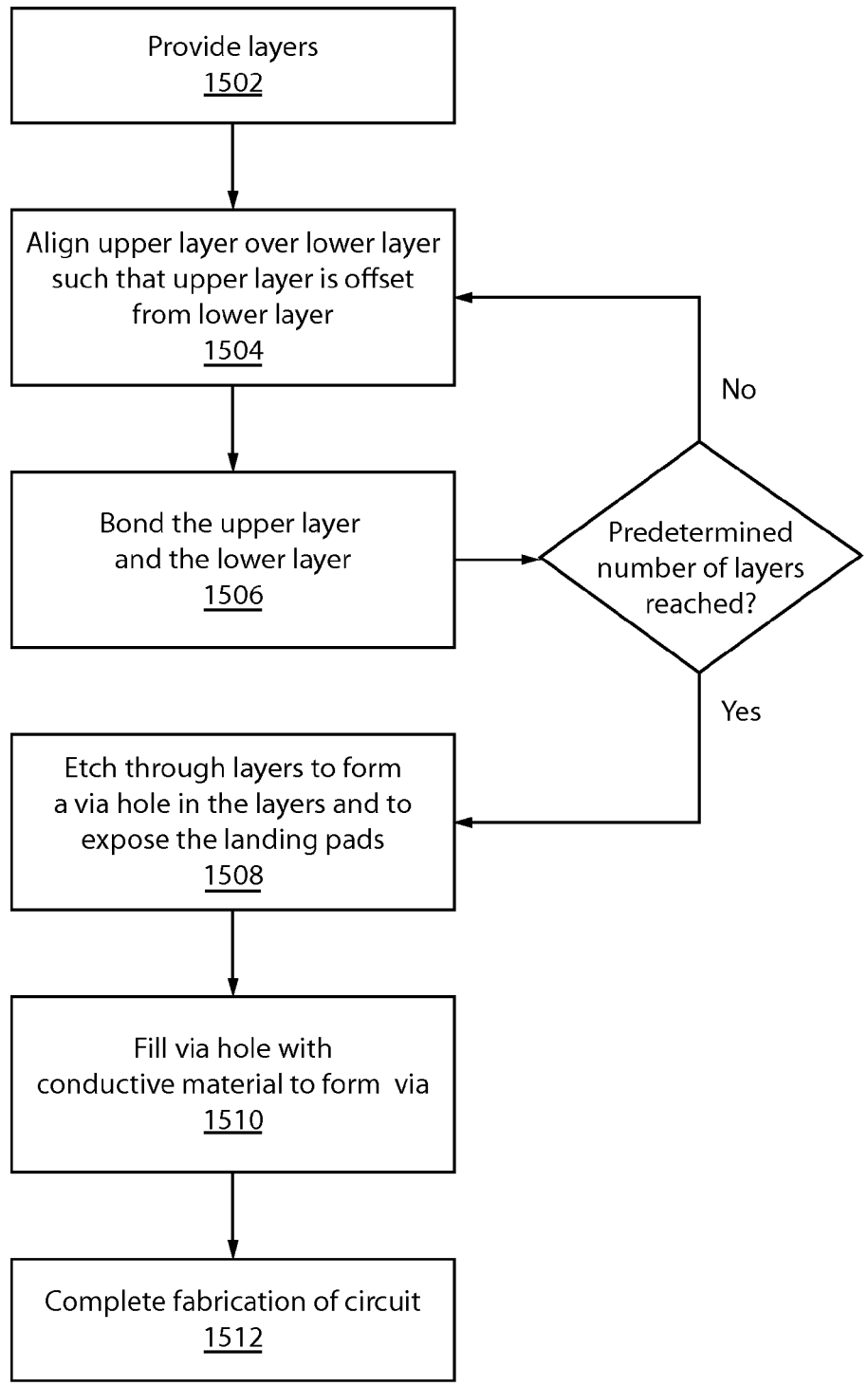
FIG. 15 is a block/flow diagram of an exemplary method for implementing a three-dimensional integration of functional components of a circuit in accordance with an exemplary embodiment.

With reference now to FIG. 15, a method 1500 for implementing three-dimensional integration (3Di) of functional components of a circuit is illustratively depicted. It should be noted that the method 1500 can incorporate each of the aspects of the present principles described above. Thus, the method 1500 can be employed to form integrated circuit components in accordance with each of the FIGS. 1-14.

The method 1500 can begin at step 1502, at which layers can be provided. For example, wafers 102a-102d, which can include respective connection and functional components, of FIG. 1 can be provided. Here, the wafers 102a-102d can be constructed, for example, as described above in accordance with FIGS. 1 and 12-14. For example, the landing pads 110 of wafers 102b, 102c and 102d and can be formed such that each of the landing pads includes a respective protective coating 108b, 108c and 108d. Further, the landing pads can be formed such that thicknesses of the protective coatings progressively increase from the protective coating of the landing pad disposed on the layer at or adjacent to the bottom of the stack to the protective coating of the landing pad disposed on the layer at the top of the stack. For example, as illustrated in FIG. 1, the thicknesses of the protective layers increase from protective layer 108b to protective layer 108d. In this embodiment, the bottom landing pad 118 does not include a protective layer; however, in other embodiments, the bottom landing pad can include a protective layer that is thinner than the protective coatings 108b, 108c and 108d. As noted above, the varying thicknesses of the protective layers ensure that subsequent etching exposes the landing pads 110 and 118 simultaneously.

At step 1504, an upper layer can be aligned over an adjacent, lower layer such that a landing pad disposed on the upper layer is offset from a landing pad disposed on the lower layer. For example, as illustrated in and described above with regard to FIG. 1, an upper wafer 102b can be aligned over the bottom wafer 102a such that the landing pad 110 of the upper wafer 102b is offset from the landing pad 118 of the bottom wafer 102a. For example, as illustrated in FIGS. 2, 3 and 5, the landing pad 204 of the upper wafer can be offset from the landing pad 202 of the bottom wafer in a variety of configurations.

At step 1506, the upper layer can be bonded to the lower layer. For example, the wafer 102b can be bonded to the wafer 102a along a bonding interface 130, as described above. If a predetermined number of layers has not been reached, then the method can proceed to step 1504 and can be iterated. For example, the number of layers can be pre-determined in accordance with design specifications of the wafer multistack component, such as components 1000 and 1100 of FIGS. 10 and 11, or of an integrated circuit that is fabricated in accordance with the method.

It should be noted that although steps 1504 and 1506 are illustrated as separate steps in FIG. 15, steps 1504 and 1506 can be combined such that the alignment described above with respect to step 1504 is implemented during the bonding of the layers. Configuring the offset of landing pads in this way is advantageous, as it is significantly simpler to implement as compared to, for example, implementing the offsets through lithography and bonding the wafers in a standard manner. For example, if the offset is implemented using lithography in this way, then each stratum of the stack would have a unique layout, thereby requiring a manufacturer to obtain several different types of wafers to produce the stack. In contrast, if the alignment is implemented during bonding, then the same layer or wafer can be applied to each stratum in the stack, thereby substantially facilitating the fabrication of the stack.

It should be further noted that the iterations of the alignment and bonding can implement a variety of offset configurations. For example, steps 1504 and 1506, or a combination thereof, can be repeated to align, as shown in FIG. 1, the wafer 102c (in this iteration, the 'upper layer' referred to above in steps 1504 and 1506) over the wafer 102b (in this iteration, the 'lower layer' referred to above in steps 1504 and 1506) such that the landing pad 110 of the wafer 102c is offset from the landing pad 110 of the wafer 102b. The next iteration can be similarly implemented with the wafer 102d as the upper layer to achieve the configuration of the stack 100 illustrated in FIG. 1. Here, the alignments in iterations of step 1504 are performed such that the landing pads are successively offset in one direction, for example, as illustrated in FIG. 2. Alternatively, the iterations of the alignment step can be performed such that that the landing pads are aligned in a spiral configuration, for example, as illustrated in FIGS. 3-5. For example, as illustrated in FIG. 3, the upper landing pads in the stack can be aligned in a spiral configuration and the landing pad disposed on a bottom-most layer in the stack can preferably be disposed at about the center of the spiral configuration. Alternatively, each of the landing pads can be aligned in a spiral configuration, as illustrated in FIGS. 4-5.

If the predetermined number of layers has been reached after step 1506, then the method can proceed to step 1508, at which the layers can be etched through to form a via hole in the layers and to expose the landing pads. For example, the layers can be etched as described above with respect to FIGS. 6-9. Further, in accordance with step 1508, the protective layers can be configured such that the protective layers are completely eroded simultaneously over at least a portion of each of the landing pads. For example, as illustrated in FIG. 9, the etching erodes protective layers 108b, 108c and 108d completely over portions 109b, 109c and 109d, respectively, of the landing pads.

At step 1510, the via hole can be filled with a conductive material to form a via that couples the landing pads of the layers, which are in a stack formed by the aligning and the bonding. For example, a single via, which can be a TSV, can be formed as described above with respect to FIG. 10 to couple each of the landing pads 110 and 118. In addition, the cross-sectional areas 150a, 150b, 150c, 150d of the landing pads of wafers 102a, 102b, 102c, and 102d, respectively that are in contact with the via 1002 can be configured to be equal or at least a minimum area to meet design specifications. However, the contact area of the landing pads can be different. In each case, the cross-sectional areas should be at or above a preset minimum value to permit good electrical contact.

At step 1512, the fabrication of the circuit can be completed.

The embodiments described herein provide several advantages over conventional 3Di methods and 3Di circuits. For example, the total volume dedicated for integration connections are substantially lower than that of conventional integration schemes. Furthermore, the principles described herein provide a significant cost benefit by achieving the integration of functional components of a circuit with substantially fewer processing steps per stratum. For example, if N add-on wafer strata are employed, then the performance of N−1 times a plurality of steps can be avoided. For example, such steps can include TSV lithography, TSV reactive ion etching (RIE), post-RIE ex-situ cleaning, wet cleaning, TSV insulation deposition, a breakthrough RIE, an additional post-RIE ex-situ cleaning, wet cleaning, liner deposition, seeding, filling of conductive material (e.g., copper), annealing, CMP, and NBLOK deposition. Thus, up to 14 steps can be avoided. In the embodiments described above, up to 7 (as low as 4) of the following steps are applied N times to define and protect the landing pads, and then open through to the layer below for via formation: lithography, RIE, post-RIE cleaning, protective layer deposition, lithography, an additional RIE and a post RIE cleaning. As such, the total amount of processing steps avoided are S=14(N−1)−7N steps per stack (N>=3). The savings accumulate as the number of wafers in the stack is increased. For example, (N, S) set: (3, 7), (4, 14), (5, 21), (6, 28), (7, 35), (8, 42), etc.

Moreover, the present principles provide a lower overhead in terms of process times and a lower impact on yield that would result from repeat processing in the same chamber/platform. Furthermore, bonders are used for alignment shifts based on the stratum of a wafer; no extra lithography masks or specific lithography shift procedures are needed. There is also a potential yield benefit stemming from the use of bonding/thinning processes. For example, the TSVs are not formed and TSV copper filling is not performed prior to bonding/thinning of subsequent wafers. Thus, the risk of bowing or warping is reduced.

The present principles also provide a simplicity in design. For example, one type of stackable wafer can be used so that each stackable wafer employs the same landing pad design. Here, only different deposition procedures are applied depending on the stratum level. These features provide a relatively easy means to customize the final product (i.e., for example, the size of a multi-stack memory). As such, extendibility for additional stacks is facilitated. In addition, landing pads can be formed on different lithography steps at the same level. There is no additional cost for an entire different level for landing pads.

Having described preferred embodiments of a via structure for three-dimensional circuit integration (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for implementing three-dimensional integration (3Di) of functional components of a circuit comprising:
    forming landing pads of upper and lower layers such that each of the landing pads includes a respective protective coating and such that a thickness of each protective coating is greater than the protective coating of any landing pad disposed on a lower layer in a stack and smaller than the protective layer of any landing pad disposed on a higher layer in the stack;
    aligning an upper layer over an adjacent, lower layer during bonding of the upper and lower layers such that a landing pad disposed on the upper layer is offset from a landing pad disposed on the lower layer;
    etching through the upper and lower layers to form a via hole in the layers and to expose the landing pads; and
    filling the via hole with a conductive material to form a via that couples the landing pads of the upper and lower layers.

2. The method of claim 1, wherein the aligning is iterated to form a stack of the layers such that an additional layer with a respective landing pad is added to the stack at each iteration of the aligning.

3. The method of claim 2, wherein the aligning comprises aligning the landing pads of at least two of the layers in the stack such that the landing pads are successively offset in one direction.

4. The method of claim 2, wherein the aligning comprises aligning each of the landing pads such that the landing pads are aligned in a spiral configuration.

5. The method of claim 2, wherein the aligning comprises aligning each of the landing pads such that upper landing pads in the stack are aligned in a spiral configuration and the landing pad disposed on a bottom-most layer in the stack is disposed at the center of the spiral configuration.

6. The method of claim 1, wherein cross-sectional areas of the landing pads of the upper and lower layers that are in contact with the conductive material are equal.

7. The method of claim 1, wherein the etching etches the protective layers such that the protective layers are completely eroded simultaneously over at least a portion of each of the landing pads.

8. The method of claim 1, wherein the via is a through-silicon via.

9. The method of claim 1, wherein said etching comprises etching only a portion of the protective coating to expose a portion of the landing pads, leaving a remaining portion of the landing pads covered with the protective coating.

10. A method for implementing three-dimensional integration (3Di) of functional components of a circuit comprising:
aligning an upper layer over an adjacent, lower layer during bonding of the upper and lower layers such that a landing pad disposed on the upper layer is offset from a landing pad disposed on the lower layer and such that the landing pads are aligned in a spiral configuration;
etching through the upper and lower layers to form a via hole in the layers and to expose the landing pads; and
filling the via hole with a conductive material to form a via that couples the landing pads of the upper and lower layers.

11. The method of claim 10, wherein the aligning is iterated to form a stack of the layers such that an additional layer with a respective landing pad is added to the stack at each iteration of the aligning.

12. The method of claim 11, wherein the aligning comprises aligning the landing pads of at least two of the layers in the stack such that the landing pads are successively offset in one direction.

13. The method of claim 11, wherein the aligning comprises aligning each of the landing pads such that upper landing pads in the stack are aligned in a spiral configuration and the landing pad disposed on a bottom-most layer in the stack is disposed at the center of the spiral configuration.

14. The method of claim 10, wherein cross-sectional areas of the landing pads of the upper and lower layers that are in contact with the conductive material are equal.

15. The method of claim 10, wherein the aligning and the bonding form a stack of the layers and wherein the method further comprises:
forming the landing pads of the upper and lower layers such that each of the landing pads includes a respective protective coating and such that thicknesses of the protective coatings progressively increase from the protective coating of the landing pad disposed on the layer at or adjacent to a bottom of the stack to the protective coating of the landing pad disposed on the layer at a top of the stack.

16. The method of claim 15, wherein the etching etches the protective layers such that the protective layers are completely eroded simultaneously over at least a portion of each of the landing pads.

17. The method of claim 10, wherein the via is a through-silicon via.

* * * * *